United States Patent
Ebe et al.

(10) Patent No.: US 6,992,320 B2
(45) Date of Patent: Jan. 31, 2006

(54) SEMICONDUCTOR OPTICAL DEVICE WITH QUANTUM DOTS HAVING INTERNAL TENSILE OR COMPRESSIVE STRAIN

(75) Inventors: Hiroji Ebe, Kawasaki (JP); Yoshiaki Nakata, Kawasaki (JP); Tomoyuki Akiyama, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 251 days.

(21) Appl. No.: 10/644,803

(22) Filed: Aug. 21, 2003

(65) Prior Publication Data

US 2004/0041145 A1 Mar. 4, 2004

(30) Foreign Application Priority Data

Aug. 27, 2002 (JP) .................................. 2002-246175

(51) Int. Cl.
- *H01L 33/00* (2006.01)
- *H01L 21/00* (2006.01)
- *H01L 29/06* (2006.01)
- *H01L 31/0328* (2006.01)
- *H01L 31/0336* (2006.01)

(52) U.S. Cl. ............................. 257/21; 257/82; 257/98; 438/22

(58) Field of Classification Search .................. 257/82, 257/98, 21, E29.021; 438/22; 372/45
See application file for complete search history.

(56) References Cited

U.S. PATENT DOCUMENTS

2002/0196827 A1 * 12/2002 Shields et al. ................ 372/45

FOREIGN PATENT DOCUMENTS

| JP | 11-15477 | 1/1999 |
|----|----------|--------|
| JP | 11-50446 | 2/1999 |

OTHER PUBLICATIONS

"Effect of GaNAs Stain Compensatin Layer over InAs Quantum Dots Grown by MOMBE", Sasikala Ganapathy et al., Indium Phosphide and Related Materials Conference, 2002, IPRM. 14$^{TH}$, May 12–16, 2002, pp. 557–560.*

Pinczolits, et al., "Direct Formation of Self–Assembled Quantum Dots Under Tensile Strain by Heteroepitaxy of PbSe on PbTe (111)", Applied Physics Letters, V. 73, No. 2, pp. 250–252; Jul. 13, 1998.*

* cited by examiner

*Primary Examiner*—William M. Brewster
(74) *Attorney, Agent, or Firm*—Armstrong, Kratz, Quintos, Hanson & Brooks, LLP

(57) ABSTRACT

A semiconductor optical device having a substrate having a surface of a first semiconductor having a first lattice constant; and a semiconductor lamination layer formed on the substrate, the semiconductor lamination layer having an active layer which contains quantum dots of a first kind made of a second semiconductor having a second lattice constant in bulk state smaller than the first lattice constant. The active layer may contain quantum dots of a second kind made of a third semiconductor having a third lattice constant in bulk state larger than the first lattice constant. The quantum dots of the first and second kinds are preferably disposed alternately along the thickness direction between the barrier layers having the first lattice constant.

37 Claims, 4 Drawing Sheets

SEMICONDUCTOR OPTICAL DEVICE WITH QUANTUM DOTS HAVING INTERNAL TENSILE OR COMPRESSIVE STRAIN

CROSS REFERENCE TO RELATED APPLICATION

This application is based on and claims priority on Japanese Patent Application No. 2002-246175 filed on Aug. 27, 2002, the entire contents of which are incorporated herein by reference.

BACKGROUND OF THE INVENTION

A) Field of the Invention

The present invention relates to a semiconductor optical device and more particularly to a semiconductor optical device having quantum dots in an active layer.

B) Description of the Related Art

Semiconductor devices are known which utilize quantization. As the thickness of a semiconductor layer becomes thin, one-dimensional quantization is possible. Semiconductor lasers and the like utilize a multi-quantum well (MQW) structure made of an alternate lamination of one-dimensionaly quantized well layers and barrier layers.

Some logical devices and the like utilize quantum wires two-dimensionally quantized by restricting the thickness and width of a semiconductor layer. Some logical devices and light emission devices utilize quantum dots three-dimensionally quantized by restricting all the sizes of a semiconductor layer along three-dimensional directions.

As material not lattice-matching an underlying substrate, i.e., material which generates strain, is epitaxially grown, micro fine islands in the order of several nm to several tens nm are grown spontaneously in some stage of the initial growth period (S-K mode). Quantum dots have been formed conventionally by utilizing this phenomenon.

Quantum dots are formed by epitaxially growing on a GaAs or InP substrate InAs or InGaAs (for InP substrate, In-rich InGaAs) having a narrower band gap and a larger lattice constant than those of the substrate. In practice, semiconductor barrier layers lattice-matching a substrate and quantum dots having a larger lattice constant and a narrower band gap are alternately laminated. This forms the structure that quantum dots having a narrow band gap are buried in the barrier layers. Compressive stress is generated in quantum dots in such a device.

As strain is generated in (as stress is applied to) a semiconductor crystal, a hole level degenerated at the band edge is split into a heavy hole level and a light hole level. In a quantum dot with compressive strain, energy difference between electron and heavy hole is smaller than energy difference between electron and light hole. In this case, interaction with transverse electric (TE) mode light becomes dominant. An optical amplifier or a laser device formed by using quantum dots with compressive strain amplifies or generates TE mode light.

A semiconductor optical device is desired which generates or amplifies transverse magnetic (TM) mode light. Such a semiconductor optical device using quantum dots is not known as yet.

In a photonic network or the like utilizing optical fibers, the polarization direction of propagating light changes and is infinite. One of the requirements of an optical amplifier is to amplify both TE mode light and TM mode light. It is not sufficient if an optical amplifier amplifies only TE mode light.

In conventional semiconductor optical devices utilizing quantum dots, interaction with TE mode light has been dominant. Quantum dots of conventional semiconductor devices have been quantum dots having compressive strain.

SUMMARY OF THE INVENTION

An object of this invention is to provide a semiconductor optical device capable of interaction with TM mode light.

Another object of this invention is to provide a semiconductor optical device using quantum dots with tensile strain.

According to one aspect of the present invention, there is provided a semiconductor optical device comprising: a substrate having a surface of a first semiconductor having a first lattice constant; and a semiconductor lamination layer formed on the substrate, the semiconductor lamination layer including an active layer which contains quantum dots of a first kind made of a second semiconductor having a second lattice constant smaller than the first lattice constant.

According to another aspect of the present invention, there is provided an optical communication system comprising: an input optical fiber for supplying an optical signal; and a semiconductor optical amplifier comprising a substrate having a surface of a first semiconductor having a first lattice constant, and a semiconductor lamination layer formed on the substrate, the semiconductor lamination layer including an active layer which contains quantum dots of a first kind made of a second semiconductor having a second lattice constant smaller than the first lattice constant and quantum dots of a second kind made of a third semiconductor having a third lattice constant larger than the first lattice constant.

Quantum dots made of material having a smaller lattice constant than that of a substrate have tensile strain.

In the quantum dots with tensile strain, an energy difference between electron and light hole is smaller than that between electron and heavy hole. Optical transitions become therefore dominant between electrons and light holes. In this case, interaction with TM mode light becomes dominant.

A semiconductor optical device having quantum dots with tensile strain can therefore be provided. Quantum dots with tensile strain can generate and amplify TM mode light It is possible to provide a semiconductor optical device capable of generating and amplifying light in both TE and TM modes. A semiconductor optical device with less polarization dependency can be realized.

DESCRIPTION OF THE PREFERRED EMBODIMENTS

In many semiconductor optical devices, an active layer for interaction with light is sandwiched between p- and n-type clad layers having a wider band gap than that of the active layer to form a pn diode structure. Forward current is caused to flow through the diode to stimulate radiative recombination of electrons and holes in the active layer.

Figure 1A:
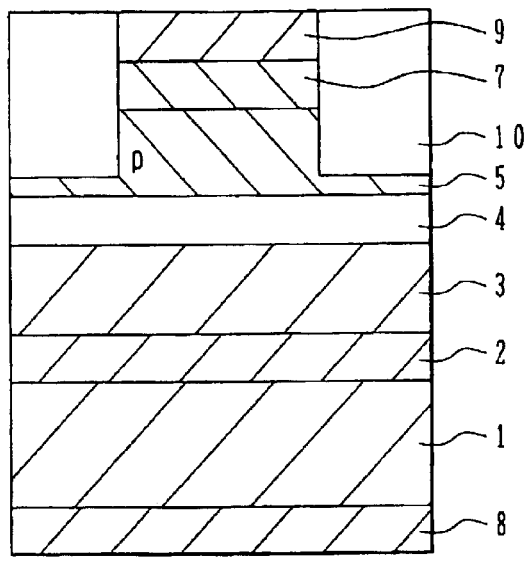
FIGS. 1A to 1D are schematic cross sectional views showing the structures of a semiconductor optical device according to an embodiment of the invention.
Figure 1B:
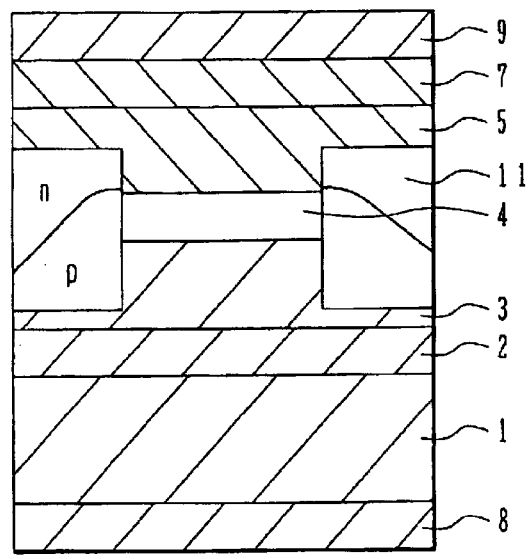

FIGS. 1A and 1B show two examples of the structure of a semiconductor optical device.

Referring to FIG. 1A, for example, on the (3 1 1) B plane of an n-type InP substrate 1, an n-type InP buffer layer 2 is epitaxially grown to a thickness of, for example, about 100 to 200 nm. The buffer layer 2 provides underlying crystal having excellent crystallinity. If the substrate crystallinity is sufficiently good, this buffer layer may be omitted. On the buffer layer 2, an n-type InP clad layer 3 is epitaxially grown to a thickness of, for example, about 3 µm. The n-type impurity concentration of the substrate 1, buffer layer 2 and clad layer 3 is, for example, $1\times10^{18}$ cm$^{-3}$.

On the n-type clad layer 3, an active layer 4 is grown to a thickness of 0.5 µm for example. The active layer 4 is non-doped and contains quantum dots with tensile strain. The structure of the active layer 4 will be later described.

On the active layer 4, a p-type InP clad layer 5 is epitaxially grown to a thickness of 3 µm for example. On the clad layer 5, a p-type $In_{0.53}Ga_{0.47}$As contact layer 7 is epitaxially grown to a thickness of 0.5 µm for example. The p-type impurity concentration of the clad layer 5 is, for example, $1\times10^{18}$ cm$^{-3}$, and the p-type impurity concentration of the contact layer 7 is, for example, $1\times10^{19}$ cm$^{-3}$.

Each semiconductor layer on and over the substrate can be epitaxially grown by molecular beam epitaxy (MBE) or metal organic chemical vapor deposition (MOCVD), although not limitative.

For example, for MBE, solid of each constituent element is used as source material, and p-type impurity Be and n-type impurity Si are used. For example, the growth temperature is set at 450 to 550° C. for the quantum dot layer, and 550° C. for other layers. For example, for MOCVD, trimethylindium (TMI) is used as In source material, phosphine is used as P source material, trimethylaluminum (TMA) is used as Al source material, triethylgallium (TEG) is used as Ga source material, diethylzinc (DEZ) is used as p-type impurity Zn, and disilane ($Si_2H_6$) is used as n-type impurity Si. The growth temperature is 450 to 550° C. for the quantum dot layer, and 600 to 700° C. for other layers.

A stripe mask is formed on the contact layer 7, and portions of the contact layer 7 and clad layer 5 on both sides of the stripe mask are etched and removed. A ridge structure is therefore formed. Both sides of the ridge structure may be buried with an insulating layer 10. An n-side electrode 8 is formed on the bottom surface of the substrate 1, and a p-side electrode 9 is formed on the contact layer 7.

If a semiconductor laser device for emitting a laser beam is to be formed by using such a semiconductor optical device, for example, the ridge width is several pm, the substrate width is about 300 µm and the substrate length (cavity length) is also about 300 µm. The semiconductor lamination structure is cleaved at both end planes of the cavity. A reflection film is sometimes formed on a non-emission plane.

If an optical amplifier is to be formed by using such a semiconductor optical device, for example, the substrate length is 300 µm to 30 mm and the substrate width is about 1 mm. The ridge width is several µm similar to the semiconductor laser. The semiconductor lamination structure is cleaved at both end planes of the cavity and antireflection films are formed on both end planes.

The above-described numerical values are only illustrative and have no limitative meanings.

FIG. 1B shows the structure of a semiconductor optical device of a buried structure. The lamination structure is similar to that shown in FIG. 1A. With the buried structure, the width of the active layer and the width of a portion of the upper and lower clad layers on the active layer are restricted. On both sides of the width restricted region of the active layer, a buried structure 11 is formed which has a light confinement effect and a current confinement effect. The buried structure 11 includes, for example, a p-type InP buried layer in contact with the n-side region and an n-type InP buried layer in contact with the p-side region.

This buried structure can be formed by growing the active region or further a portion of the upper clad layer, thereafter forming a stripe hard mask, etching the upper clad layer, the active region and part of the lower clad layer on both sides of the hard mask, and growing the burying layers. After the hard mask is removed, the remaining portion of the upper clad layer and the contact layer are grown. Other structures are similar to those shown in FIG. 1A.

Figure 1C:
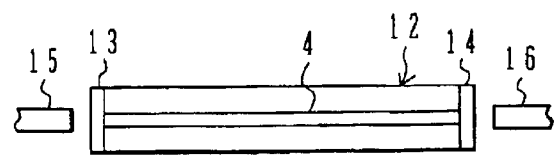

FIG. 1C is a schematic diagram showing the structure of an optical amplifier. Antireflection films 13 and 14 are formed on both end planes of an optical amplifier. An optical fiber 15 for introducing incident light is coaxially coupled to an active layer 4. An output side optical fiber 16 is coaxially coupled to light emitted from the active layer 4.

Figure 1D:
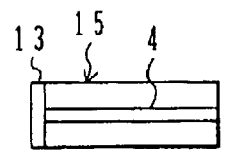

FIG. 1D is a schematic diagram showing the structure of a semiconductor laser device. One end plane of a semiconductor laser device 15 having an active layer 4 is cleaved to form a reflection plane and a laser beam output plane. The other end plane of the semiconductor layer device 15 is cleaved and then a high reflection film 13 is formed. The structure and manufacture method for such semiconductor optical devices are well known excepting the active layer, and other structures and manufacture methods may also be used. The structure of the active layer 4 will be described in detail hereinbelow.

Figure 2A:
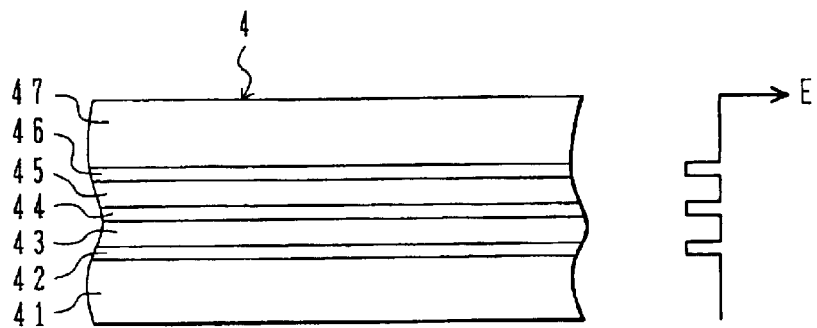
FIGS. 2A to 2D are cross sectional views and diagrams showing the structure of an active layer of the semiconductor optical device shown in FIG. 1.

FIG. 2A is a cross sectional view showing an example of the structure of an active layer. An active layer 4 is made of a semiconductor epitaxial lamination. On a barrier layer 41, which is made of undoped $In_{0.53}(Al_{0.5}Ga_{0.5})_{0.47}$As lattice matching an InP substrate, a quantum dot layer 42 is formed which is made of $In_{0.1}Ga_{0.9}$As having a relatively small lattice constant and a narrow band gap when formed as quantum dots. The quantum dot layer 42 is, for example, one to six atomic layers and has lattice mismatch with the underlying barrier layer 41. Therefore, the quantum dot layer is grown as islands (quantum dots) in the S-K (Stranski-Krastanov) mode, and not grown as a continuous film. The term "lattice constant" means the lattice constant in bulk state.

Figure 2B:
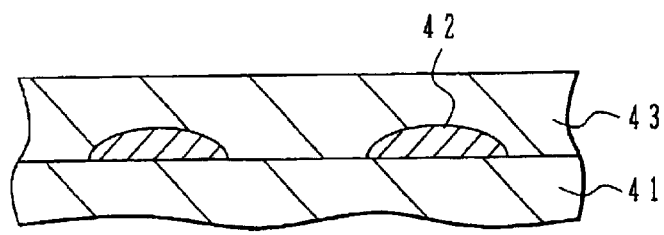

FIG. 2B is a schematic diagram showing the structure of a quantum dot layer. Island-shaped quantum dots 42 are formed on the underlying barrier layer 41. For example, the quantum dot 42 has a planar diameter of about 20 nm and a thickness of about 5 nm.

Reverting to FIG. 2A, after the quantum dot layer 42 is formed, a barrier layer 43 is formed having a thickness of, for example, about 30 nm. On the barrier layer 43, a quantum dot layer 44 is formed and a barrier layer 45 is formed on the quantum dot layer 44. Similarly, a quantum dot layer 46 and a barrier layer 47 are formed. The quantum dot layers 44 and 46 are similar to the quantum dot layer 42. The barrier layers 43, 45 and 47 are made of the same material as that of the barrier layer 41. Because the quantum dot layer has a band gap narrower than that of the barrier layer, the conduction band structure is as shown on the right side of FIG. 2A. As shown, the lowest and highest barrier layers may be made thick.

As shown in FIG. 2B, the barrier layer 43 buries the quantum dots 42 and is continuous with the barrier layer 41. As quantum dots are grown in the S-K mode, a wetting layer is sometimes formed between the barrier layers 43 and 41. The other quantum dot layers 44 and 46 are also made of discrete quantum dots which are buried in the barrier layers.

In the structure shown in FIG. 2A, three quantum dot layers are buried in the barrier layers. Each of the three quantum dot layers is made of material having a smaller lattice constant than that of the barrier layer. Tensile stress is therefore applied to the quantum dots 42. The quantum dot layers 42, 44 and 46 are layers made of quantum dots with tensile strain. Although three quantum dot layers are formed as shown in FIG. 2A, the number of quantum dot layers may be selected optionally in the range from 1 to about 20.

Figure 2C:
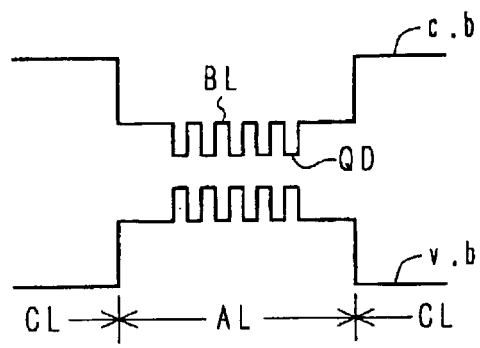

FIG. 2C is a schematic diagram showing the band structure of an active layer having five quantum dot layers. This diagram shows energies of a conduction band c.b and a valence band v.b of each of an active layer AL, and the clad layers CL on both sides of the active layer. The lateral direction represents the lamination direction. The band gap becomes small in the quantum dot layer QD so that radiative recombinations between electrons and holes become dominant in the quantum dot layer QD. The barrier layer BL and clad layer CL have a band gap wider than that of the quantum dot layer QD so that these layers are transparent relative to radiation from quantum dots.

The quantum dot layer has tensile strain. As the tensile strain is generated, the band of a light hole becomes higher than the band of a heavy hole at the band edge so that an energy difference between electron and light hole becomes smaller than an energy difference between electron and heavy hole. Optical transitions between electrons and light holes become dominant correspondingly. In this case, interaction with TM mode light becomes dominant. The semiconductor optical device described above generates or amplifies TM mode light.

With the above-described structure, quantum dots are made of $In_{0.1}Ga_{0.9}As$. Instead, quantum dots may be made of other materials which have a smaller lattice constant and a narrower band gap under the quantum effect and under the strain, than those of the barrier layer. For example, in the above-described structure, the barrier layer and quantum dots may be made of $In_{0.53}(Al_{0.5}Ga_{0.5})_{0.47}As$ and $GaN_{0.01}As_{0.99}$, respectively. Alternatively, the barrier layer and quantum dots may be made of $In_{0.53}(Al_{0.5}Ga_{0.5})_{0.47}As$ and GaAs, respectively. GaAs dots under tensile strain have a band gap narrower than that of $In_{0.53}(Al_{0.5}Ga_{0.5})_{0.47}As$. In summary, if InP is used as the material of a substrate, quantum dots can be formed by $In_xGa_{1-x}N_yAs_{1-y}$ ($0 \leq x \leq 0.5$, $0 \leq y \leq 0.5$). Although material lattice matching the substrate is used as the material of the barrier layer, material substantially lattice matching the substrate may also be used. Namely, material equivalent to lattice matching in terms of crystal growth may be used.

If GaAs is used as the material of a substrate, for example, the clad layer, barrier layer and quantum dot layer can be made of $Al_{0.5}Ga_{0.5}As$, $Al_{0.3}Ga_{0.7}As$ and $GaAs_{0.5}P_{0.5}$, respectively.

Mixed crystal may be used as the material of a substrate. For example, if an $In_{0.2}Ga_{0.8}As$ substrate is used, a clad layer is made of $In_{0.2}Ga_{0.8}As$ same as the material of the substrate, the barrier layer is made of $In_{0.2}(Al_{0.5}Ga_{0.5})_{0.8}As$, and the quantum dot layer is made of $GaAs_{0.9}P_{0.1}$.

Figure 2D:
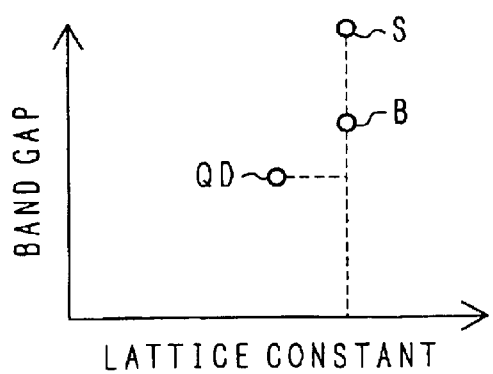

FIG. 2D is a graph showing the relation between lattice constants and band gaps of a substrate S, a barrier layer B and quantum dots QD. For the quantum dots QD, the lattice constant is a value in a bulk state and the band gap is a value under the quantum effect and strain. The substrate S and barrier layer B are lattice matched or substantially lattice matched. The quantum dots QD are lattice mismatched and have a smaller lattice constant. The band gap becomes narrower in the order of the substrate S, barrier layer B and quantum dots QD.

In the above-described structure, the clad layer is made of the same material as that of the substrate and has the same band gap and lattice constant as those of the substrate. Other materials may also be used which lattice match the substrate and have a wider band gap than that of the barrier layer.

A semiconductor optical device capable of emitting or amplifying light in both TE and TM modes can be realized by using a combination of quantum dots with tensile strain and quantum dots with compressive strain.

Figure 3A:
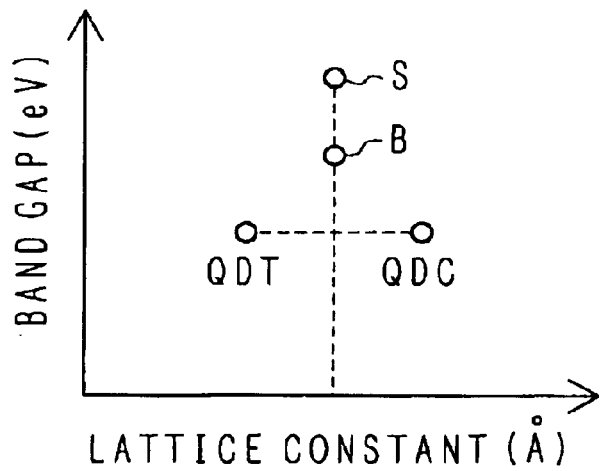
FIGS. 3A and 3B are diagrams for illustrating a semiconductor optical device according to another embodiment of the invention.

FIG. 3A is a graph showing the relation between lattice constants and band gaps of a substrate S, a barrier layer B, quantum dots QDT with tensile strain and quantum dots QDC with compressive strain. For the quantum dots, the lattice constant is a value in a bulk state and the band gap is a value under the quantum effect and strain. The relation of the substrate S, barrier layer B and quantum dots QDT with tensile strain is the same as that of the substrate S, barrier layer B and quantum dots QD shown in FIG. 2D. The quantum dots QDC with compressive strain have a lattice constant larger than that of the substrate S and the same band gap as that of the quantum dots with tensile strain.

The substrate S, barrier layer B, quantum dots QDT and quantum dots QDC can be made of InP, $In_{0.53}(Al_{0.5}Ga_{0.5})_{0.47}As$ or $In_{0.854}Ga_{0.146}As_{0.318}P_{0.682}$, GaAs, and InAs, respectively.

Figure 3B:
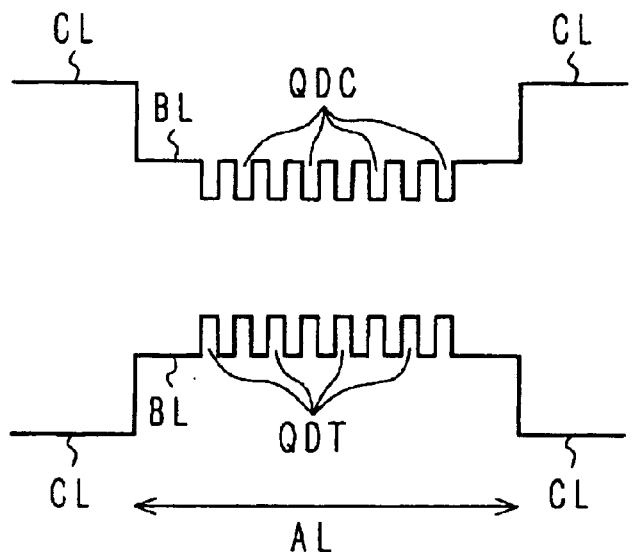

FIG. 3B shows the structure of the active layer with the clad layers on both sides of the active layer. The active layer AL is sandwiched by a pair of clad layers CL and includes a lamination of barrier layers BL and quantum dot layers QDC and QDT. The quantum dot layer QDC with compressive strain and quantum dot layer QDT with tensile strain are alternately formed with the barrier layer BL being interposed therebetween.

The quantum dots QDC with compressive strain generate and amplify light in the TE mode. The quantum dots QDT with tensile strain generate and amplify light in the TM mode. By equalizing both the functions, a semiconductor optical device with no polarization dependency can be manufactured. The ratio of the TM mode and the TE mode can be controlled.

Figure 4A:
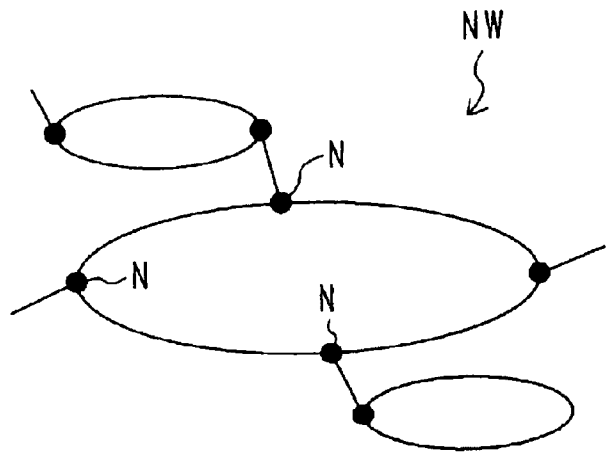
FIGS. 4A to 4C are diagrams for illustrating a photonic network.

FIG. 4A shows a photonic network using semiconductor optical devices described above. A plurality of nodes N are coupled by optical fibers to constitute a photonic network NW. Each node N has an optical amplifier and an optical switch.

Figure 4B:
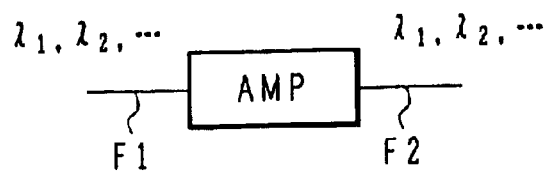

FIG. 4B shows an example of a semiconductor optical amplifier at a node N. A light signal having wavelengths λ1, λ2, λ3, . . . is input via an input fiber F1 to an optical amplifier AMP, amplified and output to an output fiber F2.

Figure 4C:
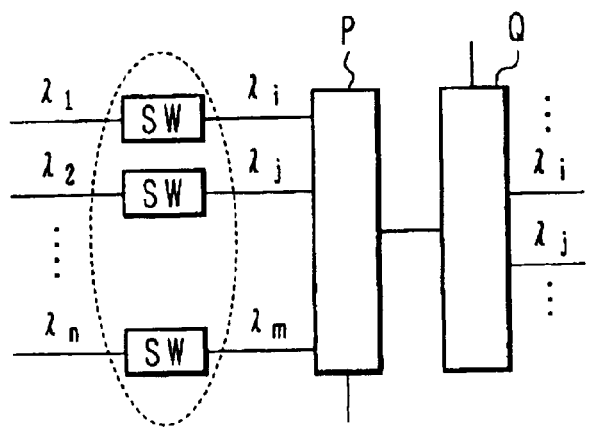

FIG. 4C shows an example of an optical switch. Light signals having single wavelengths λ1, λ2, λ3, . . . are input to an optical switch SW which amplifies or shuts the light signals to selectively supply them to an optical multiplexer P. The optical multiplexer P is coupled to an optical demultiplexer Q.

The present invention has been described in connection with the preferred embodiments. The invention is not limited only to the above embodiments. It will be apparent to those skilled in the art that various modifications, improvements, combinations, and the like can be made.

What we claim are:

1. A semiconductor optical device comprising:
   a substrate having a surface of a first semiconductor having a first lattice constant; and
   a semiconductor lamination layer formed on said substrate, said semiconductor lamination layer having an active layer which contains quantum dots of a first kind made of a second semiconductor having a second lattice constant smaller than the first lattice constant, and quantum dots of a second kind made of a third semiconductor having a third lattice constant larger than the first lattice constant.

2. A semiconductor optical device according to claim 1, wherein the active layer further includes barrier layers substantially lattice matching the first lattice constant, and the quantum dots of the first kind and the second kind are buried in the barrier layers.

3. A semiconductor optical device according to claim 1, wherein the quantum dots of the first and second kinds are alternately distributed along a thickness direction in plane shape among the barrier layers.

4. A semiconductor optical device according to claim 2, wherein the quantum dots of the first and second kinds are alternately distributed along a thickness direction in plane shape among the barrier layers.

5. A semiconductor optical device according to claim 1, wherein the first semiconductor is InP and the second semiconductor is $In_xGa_{1-x}N_yAs_{1-y}$ ($0 \leq x \leq 0.5$, $0 \leq y \leq 0.5$).

6. A semiconductor optical device according to claim 1, wherein the first semiconductor is GaAs and the second semiconductor is GaAsP.

7. A semiconductor optical device according to claim 1, wherein the active layer has a pair of end planes constituting a cavity, and the device further comprising antireflection films formed on the pair of end planes.

8. A semiconductor optical device according to claim 2, wherein the active layer has a pair of end planes constituting a cavity, and the device further comprising antireflection films formed on the pair of end planes.

9. A semiconductor optical device according to claim 8, further comprising a pair of optical fibers optically coupled to the pair of end planes.

10. Semiconductor optical device an active layer and having quantum dots with tensile internal strain and quantum dots with internal compressive strain wherein said internal tensile strain quantum dots and said internal compressive strain quantum dots are dispersed on the same active layer.

11. An optical communication system comprising:
    an input optical fiber for supplying an optical signal; and
    a semiconductor optical amplifier comprising a substrate having a surface of a first semiconductor having a first lattice constant, and a semiconductor lamination layer formed on said substrate, said semiconductor lamination layer having an active layer which contains quantum dots of a first kind made of a second semiconductor having a second lattice constant in bulk state smaller than the first lattice constant and quantum dots of a second kind made of a third semiconductor having a third lattice constant in bulk state larger than the first lattice constant.

12. An optical communication system according to claim 11, wherein the active layer further includes barrier layers substantially lattice matching the first lattice constant, and the quantum dots of the first and second kind are buried among the barrier layers.

13. An optical communication system according to claim 12, wherein the quantum dots of the first and second kinds are alternately distributed along a thickness direction in plane shape among the barrier layers.

14. An optical communication system according to claim 11, wherein the first semiconductor is InP and the second semiconductor is $In_xGa_{1-x}N_yAs_{1-y}$ ($0 \leq x \leq 0.5$, $0 \leq y \leq 0.5$).

15. An optical communication system according to claim 11, wherein the first semiconductor is GaAs and the second semiconductor is GaAsP.

16. An optical communication system according to claim 11, wherein the first semiconductor is InP, the second semiconductor is GaAs and the third semiconductor is InAs.

17. An optical communication system according to claim 11, wherein the active layer has a pair of end planes constituting a cavity, and the amplifier further comprising antireflection films formed on the pair of end planes.

18. An optical communication system according to claim 17, further comprising an output optical fiber optically coupled to a remaining one of the pair of end planes.

19. A semiconductor optical device comprising:
    a substrate having a surface of a first semiconductor of InP having a fist lattice constant; and
    a semiconductor lamination layer formed on said substrate, said semiconductor lamination layer having an active layer which contains quantum dots of a first kind made of a second semiconductor of $In_xGa_{1-x}N_yAs_{1-y}$ ($0 \leq x \leq 0.5$, $0 \leq y \leq 0.5$) having a second lattice constant smaller than the first lattice constant.

20. A semiconductor optical device according to claim 19, wherein the active layer further includes barrier layers substantially lattice matching the first lattice constant, and the quantum dots of the first kind are buried in the barrier layers.

21. A semiconductor optical device according to claim 19, wherein the active layer of said semiconductor lamination layer contains quantum dots of a second kind made of a third semiconductor having a third lattice constant larger than the first lattice constant.

22. A semiconductor optical device according to claim 20, wherein the active layer of said semiconductor lamination layer contains quantum dots of a second kind made of a third semiconductor having a third lattice constant in bulk state larger than the first lattice constant.

23. A semiconductor optical device according to claim 21, wherein the quantum dots of the first and second kinds are alternately distributed along a thickness direction in plane shape among the barrier layers.

24. A semiconductor optical device according to claim 22, wherein the quantum dots of the first and second kinds are alternately distributed along a thickness direction in plane shape among the barrier layers.

25. A semiconductor optical device according to claim 19, wherein the active layer has a pair of end planes constituting a cavity, and the device further comprising antireflection films formed on the pair of end planes.

26. A semiconductor optical device according to claim 22, wherein the active layer has a pair of end planes constituting a cavity, and the device further comprising antireflection films formed on the pair of end planes.

27. A semiconductor optical device according to claim 26, further comprising a pair of optical fibers optically coupled to the pair of end planes.

28. A semiconductor optical device according to claim 21, wherein the third semiconductor is InAs.

29. A semiconductor optical device comprising:
a substrate having a surface of a first semiconductor of GaAs having a first lattice constant; and
a semiconductor lamination layer formed on said substrate, said semiconductor lamination layer having an active layer which contains quantum dots of a first kind made of a second semiconductor of GaAsP having a second lattice constant smaller than the first lattice constant.

30. A semiconductor optical device according to claim 29, wherein the active layer further includes barrier layers substantially lattice matching the first lattice constant, and the quantum dots of the first kind are buried in the barrier layers.

31. A semiconductor optical device according to claim 29, wherein the active layer of said semiconductor lamination layer contains quantum dots of a second kind made of a third semiconductor having a third lattice constant larger than the first lattice constant.

32. A semiconductor optical device according to claim 30, wherein the active layer of said semiconductor lamination layer contains quantum dots of a second kind made of a third semiconductor having a third lattice constant in bulk state larger than the first lattice constant.

33. A semiconductor optical device according to claim 31, wherein the quantum dots of the first and second kinds are alternately distributed along a thickness direction in plane shape among the barrier layers.

34. A semiconductor optical device according to claim 32, wherein the quantum dots of the first and second kinds are alternately distributed along a thickness direction in plane shape among the barrier layers.

35. A semiconductor optical device according to claim 29, wherein the active layer has a pair of end planes constituting a cavity, and the device further comprising antireflection films formed on the pair of end planes.

36. A semiconductor optical device according to claim 32, wherein the active layer has a pair of end planes constituting a cavity, and the device further comprising antireflection films formed on the pair of end planes.

37. A semiconductor optical device according to claim 36, further comprising a pair of optical fibers optically coupled to the pair of end planes.

* * * * *